(12) United States Patent
Debe et al.

(10) Patent No.: US 10,927,448 B2
(45) Date of Patent: Feb. 23, 2021

(54) CATALYST ELECTRODES, AND METHODS OF MAKING AND USING THE SAME

(71) Applicant: 3M INNOVATIVE PROPERTIES COMPANY, St. Paul, MN (US)

(72) Inventors: Mark K. Debe, Stillwater, MN (US); Radoslav Atanasoski, Oakland, CA (US); Susan M. Hendricks, Lake Elmo, MN (US); George D. Vernstrom, Cottage Grove, MN (US)

(73) Assignee: 3M Innovative Properties Company, St. Paul, MN (US)

(*) Notice: Subject to any disclaimer, the term of this patent is extended or adjusted under 35 U.S.C. 154(b) by 378 days.

(21) Appl. No.: 15/704,741

(22) Filed: Sep. 14, 2017

(65) Prior Publication Data

US 2018/0002807 A1    Jan. 4, 2018

Related U.S. Application Data

(63) Continuation of application No. 14/350,290, filed as application No. PCT/US2012/057897 on Sep. 28, 2012, now abandoned.
(Continued)

(51) Int. Cl.
*C23C 14/34*        (2006.01)
*C25B 11/04*        (2021.01)
(Continued)

(52) U.S. Cl.
CPC .......... *C23C 14/3414* (2013.01); *C23C 14/14* (2013.01); *C23C 14/205* (2013.01);
(Continued)

(58) Field of Classification Search
CPC . C23C 14/12; C23C 14/5813; C23C 14/5806; C23C 14/14; C23C 14/205
See application file for complete search history.

(56) References Cited

U.S. PATENT DOCUMENTS 4,039,409 A    8/1977  LaConti
4,340,276 A    7/1982  Maffitt
(Continued)

FOREIGN PATENT DOCUMENTS

GB    1147442       4/1969
JP    2010-082555   4/2010
(Continued)

OTHER PUBLICATIONS

Annex to the European Search Report on European Patent Application No. EP 16203586; date of completion of the search, Aug. 21, 2017, 10 pages.
(Continued)

*Primary Examiner* — Jason Berman

(57) ABSTRACT

Methods of making catalyst electrodes comprising sputtering at least Pt and Ir onto nanostructured whiskers to provide multiple alternating layers comprising, respectively in any order, at least Pt and Ir. In some exemplary embodiments, catalyst electrodes described, or made as described, herein are anode catalyst, and in other exemplary embodiments cathode catalyst. Catalysts electrodes are useful, for example, in generating $H_2$ and $O_2$ from water.

15 Claims, 2 Drawing Sheets

Related U.S. Application Data

(60) Provisional application No. 61/545,409, filed on Oct. 10, 2011.

(51) Int. Cl.

| | | |
|---|---|---|
| *C25B 9/10* | (2006.01) | |
| *C25B 1/04* | (2021.01) | |
| *C23C 14/58* | (2006.01) | |
| *C23C 14/14* | (2006.01) | |
| *C23C 14/20* | (2006.01) | |

(52) U.S. Cl.
CPC ...... *C23C 14/5806* (2013.01); *C23C 14/5813* (2013.01); *C25B 1/04* (2013.01); *C25B 9/10* (2013.01); *C25B 11/04* (2013.01); *C25B 11/0494* (2013.01); *Y02E 60/36* (2013.01)

(56) References Cited

U.S. PATENT DOCUMENTS

| | | | |
|---|---|---|---|
| 4,384,941 A | 5/1983 | Okamoto | |
| 4,568,598 A | 2/1986 | Bilkadi | |
| 4,812,352 A | 3/1989 | Debe | |
| 5,039,561 A | 8/1991 | Debe | |
| 5,338,430 A | 8/1994 | Parsonage | |
| 5,879,827 A | 3/1999 | Debe | |
| 5,879,828 A | 3/1999 | Debe | |
| 6,040,077 A | 3/2000 | Debe | |
| 6,136,412 A | 10/2000 | Spiewak | |
| 6,319,293 B1 | 11/2001 | Debe | |
| 6,428,584 B1* | 8/2002 | Debe | H01M 8/1023 29/623.1 |
| 6,624,328 B1 | 9/2003 | Guerra | |
| 7,094,492 B2 | 8/2006 | Matsubara | |
| 1,645,655 A1 | 11/2006 | Pak | |
| 7,348,088 B2 | 3/2008 | Hamrock | |
| 7,419,741 B2 | 9/2008 | Vernstrom | |
| 7,790,304 B2 | 9/2010 | Hendricks | |
| 7,901,829 B2 | 3/2011 | Debe | |
| 8,637,193 B2 | 1/2014 | Steinbach | |
| 8,663,868 B2 | 3/2014 | Smith | |
| 2002/0004453 A1 | 1/2002 | Haugen | |
| 2002/0071984 A1* | 6/2002 | Dristy | H01M 8/0297 429/509 |
| 2002/0100725 A1 | 8/2002 | Lee | |
| 2002/0198112 A1* | 12/2002 | Paranthaman | C23C 14/024 505/236 |
| 2004/0048466 A1 | 3/2004 | Gore | |
| 2004/0116742 A1 | 6/2004 | Guerra | |
| 2005/0089748 A1 | 4/2005 | Ohlsen | |
| 2007/0243452 A1* | 10/2007 | Weidman | H01M 4/8817 429/483 |
| 2008/0020923 A1 | 1/2008 | Debe | |
| 2009/0045182 A1* | 2/2009 | Lerner | H01L 21/67109 219/121.85 |
| 2009/0081500 A1 | 3/2009 | Botte | |
| 2010/0035030 A1* | 2/2010 | Huang | C23C 14/086 428/201 |
| 2010/0279210 A1 | 11/2010 | Debe | |
| 2011/0027655 A1* | 2/2011 | Rojeski | B82Y 30/00 429/231.8 |
| 2013/0101918 A1 | 4/2013 | Yandrasits | |
| 2014/0246304 A1 | 9/2014 | Debe | |

FOREIGN PATENT DOCUMENTS

| | | |
|---|---|---|
| WO | WO 99/19930 | 4/1999 |
| WO | 2000/79630 | 12/2000 |
| WO | 2005/035444 | 4/2005 |
| WO | WO 2005/049199 | 6/2005 |
| WO | 2011/139705 | 11/2011 |

OTHER PUBLICATIONS

Chow, "Fabrication of Biologically Based Microstructure Composites for Vacuum Field Emission", Materials Science and Engineering, 1992, vol. A158, pp. 1-6.

Debe, "Vacuum Vapor Deposited Thin Films of a Perylene Dicarboximide Derivative: Microstructure Versus Deposition Parameters", Journal of Vacuum Science & Technology A, May/Jun. 1988, vol. 6, No. 3, pp. 1907-1911.

Debe, "Effect of Gravity on Copper Phthalocyanine Thin Films III: Microstructure Comparisons of Copper Phthalocyanine Thin Films Grown in Microgravity and Unit Gravity", Thin Solid Films, May 1990, vol. 186, No. 2, pp. 327-347.

Kam, "Summary Abstract: Dramatic Variation of the Physical Microstructure of a Vapor Deposited Organic Thin Film", Journal of Vacuum Science & Technology A, Jul./Aug. 1987, vol. 5, No. 4, pp. 1914-1916.

Lee, "Measurement and Modeling of the Reflectance-Reducing Properties of Gradient Index Microstructured Surfaces", Photographic Science and Engineering, Jul./Aug. 1980, vol. 24, No. 4, pp. 211-216.

Liu, "RRDE Measurements of ORR Activity of $Pt_{1-x}Ir_x$ ($0<x<0.3$) on High Surface Area NSTF-coated GC Disks", ECS Transactions, 2009, vol. 25, No. 1, pp. 625-634.

Miles, "The Oxygen Evolution Reaction on Platinum, Iridium, Ruthenium and Their Alloys at 80° in Acid Solutions", Electrochimica Acta., Jun. 1, 1978, vol. 23, No. 6, pp. 521-526.

Ohnuma, "Amorphous Ultrafine Metallic Particles Prepared by Sputtering Method", Rapidly Quenched Metals, Proceedings of the Fifth International Conference on Rapidly Quenched Metals, Würzburg, Germany, Sep. 3-7, 1984, vol. 2, Editor: S. Steeb, Elsevier Science Publishers B.V., 1985, pp. 1117-1124.

Sadaoka, "Effects of Morphology on $NO_2$ Detection in Air at Room Temperature with Phthalocyanine Thin Films", Journal of Materials Science, 1990, vol. 25, pp. 5257-5268.

Tang, "High Dispersion and Electrocatalytic Properties of Platinum on Well-aligned Carbon Nanotube Arrays", Carbon, 2004, vol. 42, pp. 191-197.

Wang, "Decomposition of hydrogen iodide over Pt—Ir/C bimetallic catalyst", International Journal of Hydrogen Energy, Sep. 2010, vol. 35, No. 17, pp. 8862-8867.

Yacaman, "On the Structure of Pt—Ir Bimetallic Catalyst", Applications of Surface Science, Sep. 1980, vol. 6, No. 1, pp. 71-75.

International Search Report for PCT International Application No. PCT/US2012/057897 dated Mar. 4, 2013, 4 pages.

European Search Report for European Application No. 16203586.9, date of completion of the search, Aug. 21, 2017 (10 pages).

* cited by examiner

CATALYST ELECTRODES, AND METHODS OF MAKING AND USING THE SAME

CROSS REFERENCE TO RELATED APPLICATION

This application is a continuation of Ser. No. 14/350,290, filed Apr. 7, 2014, which is National Stage Filing under 35 U.S.C. 371 of PCT/US2012/057897, filed Sep. 28, 2012, which claims priority to U.S. Application No. 61/545,409, filed Oct. 10, 2011, the disclosure of which is incorporated by reference in their entirety herein.

BACKGROUND

Water based electrolyzers are common electrochemical devices for producing ultra-pure (e.g., typically, at least 99.9% pure) high pressure hydrogen from pure water. They usually contain membrane electrode assemblies similar to proton exchange membrane for fuel cells. Proton exchange membrane based electrolyzers, however, produce hydrogen at the cathode (via a hydrogen evolution reaction) and oxygen at the anode (via an oxygen evolution reaction). Whereas in a proton exchange membrane fuel cell, the oxygen reduction reaction at the cathode is the sluggish reaction and responsible for nearly all the kinetic overpotential in a fuel cell, with little effect from the hydrogen oxidation reaction at the anode, in an electrolyzer, the oxygen evolution reaction is the sluggish reaction and the hydrogen evolution reaction is the facile reaction. Another significant difference is that whereas fuel cells produce cell voltages below 1 volt, electrolyzers need applied cell voltages above about 1.5 volt (anode to cathode) in order to produce useable hydrogen production rates.

Typical state-of-the-art proton exchange membrane electrolyzers with at least 2 mg/cm$^2$ of platinum group metal catalysts (e.g., IrOxides, PtIrOxides, PtRuOxides) on the anode produce on the order of 2 A/cm$^2$ with 1.85 volt applied bias potential. To withstand such relatively high voltages, only solid metallic particles of catalysts (so called blacks) are traditionally used since carbon supported catalysts would quickly corrode and burn away. Customarily, even though the cathodes potentials remain close to the reversible hydrogen potential, electrolyzer manufacturers also used blacks on the cathodes to avoid catastrophic failure should any problem occur such as cathode cell reversal that would subject the cathode catalyst to a high potential. These severe operating conditions in the electrolyzer impede new catalyst technology from being introduced into the field since the introduction of the platinum group metal blacks decades ago.

Further, the lack of sufficient oxygen evolution reaction activity and stability of the platinum group metal blacks requires relatively high catalyst loadings which keeps capital costs very high. There is a need, for example, for more effective proton exchange membrane electrolyzer catalysts that can operate at the same potentials (efficiencies) as conventional platinum group metal blacks but at much reduced loadings.

SUMMARY

In one aspect, the present disclosure describes a method of making catalyst electrode comprising:

sputtering (a form of physical vapor deposition) at least Pt and Ir onto nanostructured whiskers to provide multiple alternating layers comprising respectively in any order Pt and Ir; and radiation annealing (e.g., laser annealing) at least some of the multiple alternating layers comprising respectively Pt and Ir at least in part in an atmosphere comprising an absolute oxygen partial pressure of at least 2 kPa (in some embodiments, at least 5 kPa, 10 kPa, or even at least 20 kPa) oxygen. In some embodiments, the Pt and Ir are present in an atomic ratio in a range from 10:1 to 1:10. Typically, a layer comprising Ir contains at least 30 atomic percent (in some embodiments, at least 40, 50, 60, 70, 80, 90, 95, or even 100 atomic percent Ir.

In another aspect, the present disclosure describes a method of making catalyst electrode comprising:

sputtering at least Pt and Ir onto nanostructured whiskers to provide multiple alternating layers comprising respectively in any order Pt and Ir, wherein at least a portion of the multiple alternating layers are up to 20 (in some embodiments, less than 15, 10, 5, or even less than 2 Angstroms thick. In some embodiments, the Pt and Ir are present in an atomic ratio in a range from 5:1 to 1:5. Typically, a layer comprising Ir contains at least 30 atomic percent (in some embodiments, at least 40, 50, 60, 70, 75, 80, 90, or even 100 atomic percent) Ir.

In another aspect, the present disclosure describes a method of making catalyst electrode comprising:

sputtering at least Pt, Ir, and Ru onto nanostructured whiskers to provide multiple alternating layers comprising respectively in any order Pt, Ir, and Ru. In some embodiments, the Pt, Ir, and Ru are present in atomic ratios in a range from 0.1:5:5 to 10:0.05:0.05. In some embodiments, the method further comprises radiation annealing (e.g., laser annealing) the nanostructured thin film catalyst at least in part in air and with irradiation at an incident energy fluence of at least 20 mJ/mm$^2$, for example, with a 10.6 micrometer wavelength $CO_2$ laser having an average beam power of 30.7 watts and average beam width of 1 mm, that is delivered in the form of 30 microsecond pulses at a repetition rate of 20 kHz while scanning over the surface at about 7.5 m/sec in five sequential passes, each displaced 0.25 mm from the previous pass Typically, a layer comprising Pt contains at least 10 atomic percent (in some embodiments, at least 20, 25, 30, 40, 50, 60, 70, 75, 80, 90, or even 100 atomic percent) Pt. Typically, a layer comprising Ir contains at least 5 atomic percent (in some embodiments, at least 10, 20, 25, 30, 40, 50, 60, 70, 75 80, 90, or even 100 atomic percent) Ir. Typically, a layer comprising Ru contains at least 5 atomic percent (in some embodiments, at least 10, 20, 25, 30, 40, 50, 60, 70, 75, 80, 90, or even 100 atomic percent) Ru.

In some exemplary embodiments, catalyst electrodes described, or made as described, herein are an electrolyzer anode catalyst, and in other exemplary embodiments an electrolyzer cathode catalyst. Both electrode catalysts together are useful, for example, in generating $H_2$ and $O_2$ from water. For example, hydrogen and oxygen can be generated from water by a method comprising:

providing a membrane electrode assembly comprising an anode catalyst comprising nanostructured whiskers having thereon multiple alternating layers comprising respectively in any order Pt and Ir (or other anode catalyst) and a cathode;

providing water contact the catalyst; and providing an electrical potential with sufficient current across the a membrane electrode assembly (i.e., anode to cathode) to convert at least a portion of the water to hydrogen and oxygen on the cathode and anode respectively. Typically, a layer comprising Pt contains at least 30 atomic percent (in some embodiments, at least 40, 50, 60, 70, 75, 80, 90, or even 100 atomic percent) Pt. Typically, a layer comprising Ir contains at least 10 percent (in some embodiments, at least 20, 25, 30, 40, 50, 60, 70, 75, 80, 90, or even 100 atomic percent) Ir.

DETAILED DESCRIPTION

Figure 1:
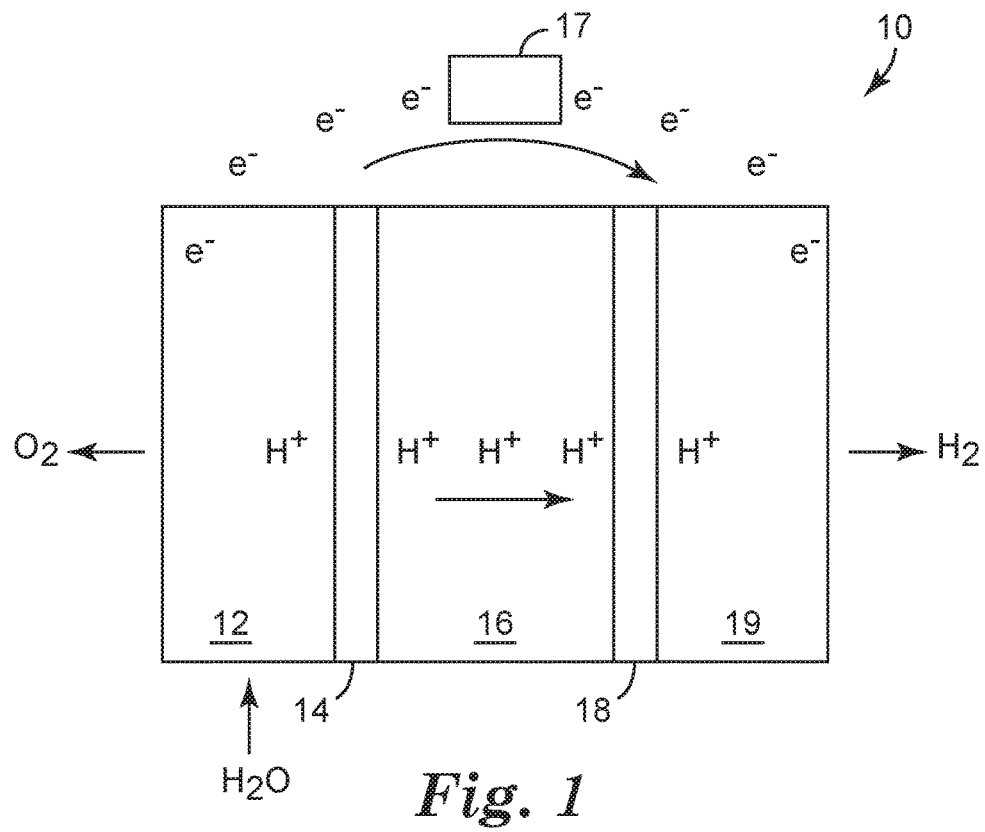
FIG. 1 is a schematic of an exemplary water electrolyzer.

Nanostructured whiskers can be provided by techniques known in the art, including those described in U.S. Pat. No. 4,812,352 (Debe), U.S. Pat. No. 5,039,561 (Debe), U.S. Pat. No. 5,338,430 (Parsonage et al.), U.S. Pat. No. 6,136,412 (Spiewak et al.), and U.S. Pat. No. 7,419,741 (Verstrom et al.), the disclosures of which are incorporated herein by reference. In general, nanostructured whiskers can be provided, for example, by vacuum depositing (e.g., by sublimation) a layer of organic or inorganic onto substrate (e.g., a microstructured catalyst transfer polymer), and then converting the perylene red pigment into nanostructured whiskers by thermal annealing. Typically the vacuum deposition steps are carried out at total pressures at or below about $10^{-3}$ Torr or 0.1 Pascal. Exemplary microstructures are made by thermal sublimation and vacuum annealing of the organic pigment C.I. Pigment Red 149 (i.e., N,N'-di(3,5-xylyl) perylene-3,4:9,10-bis(dicarboximide)). Methods for making organic nanostructured layers are disclosed, for example, in Materials Science and Engineering, A158 (1992), pp. 1-6; J. Vac. Sci. Technol. A, 5 (4), July/August, 1987, pp. 1914-16; J. Vac. Sci. Technol. A, 6, (3), May/August, 1988, pp. 1907-11; Thin Solid Films, 186, 1990, pp. 327-47; J. Mat. Sci., 25, 1990, pp. 5257-68; Rapidly Quenched Metals, Proc. of the Fifth Int. Conf. on Rapidly Quenched Metals, Wurzburg, Germany (Sep. 3-7, 1984), S. Steeb et al., eds., Elsevier Science Publishers B.V., New York, (1985), pp. 1117-24; Photo. Sci. and Eng., 24, (4), July/August, 1980, pp. 211-16; and U.S. Pat. No. 4,340,276 (Maffitt et al.) and U.S. Pat. No. 4,568,598 (Bilkadi et al.), the disclosures of which are incorporated herein by reference. Properties of catalyst layers using carbon nanotube arrays are disclosed in the article "High Dispersion and Electrocatalytic Properties of Platinum on Well-Aligned Carbon Nanotube Arrays," Carbon 42 (2004) 191-197. Properties of catalyst layers using grassy or bristled silicon are disclosed in U.S. Pat. App. Pub. 2004/0048466 A1 (Gore et al.).

Vacuum deposition may be carried out in any suitable apparatus (see, e.g., U.S. Pat. No. 5,338,430 (Parsonage et al.), U.S. Pat. No. 5,879,827 (Debe et al.), U.S. Pat. No. 5,879,828 (Debe et al.), U.S. Pat. No. 6,040,077 (Debe et al.), and U.S. Pat. No. 6,319,293 (Debe et al.), and U.S. Pat. App. Pub. No. 2002/0004453 A1 (Haugen et al.), the disclosures of which are incorporated herein by reference. One exemplary apparatus is depicted schematically in FIG. 4A of U.S. Pat. No. 5,338,430 (Parsonage et al.), and discussed in the accompanying text, wherein the substrate is mounted on a drum which is then rotated over a sublimation or evaporation source for depositing the organic precursor (e.g., perylene red pigment) to the nanostructured whiskers.

Typically, the nominal thickness of deposited perylene red pigment is in a range from about 50 nm to 500 nm. Typically, the whiskers have an average cross-sectional dimension in a range from 20 nm to 60 nm and an average length in a range from 0.3 micrometer to 3 micrometers.

In some embodiments, the whiskers are attached to a backing. Exemplary backings comprise polyimide, nylon, metal foils, or other material that can withstand the thermal annealing temperature up to 300° C. In some embodiments, the backing has an average thickness in a range from 25 micrometers to 125 micrometers.

In some embodiments, the backing has a microstructure on at least one of its surfaces. In some embodiments, the microstructure is comprised of substantially uniformly shaped and sized features at least three (in some embodiments, at least four, five, ten or more) times the average size of the nanostructured whiskers. The shapes of the microstructures can, for example, be V-shaped grooves and peaks (see, e.g., U.S. Pat. No. 6,136,412 (Spiewak et al.), the disclosure of which is incorporated herein by reference) or pyramids (see, e.g., U.S. Pat. No. 7,901,829 (Debe et al.), the disclosure of which is incorporated herein by reference). In some embodiments some fraction of the features of the microstructures extend above the average or majority of the microstructured peaks in a periodic fashion, such as every $31^{st}$ V-groove peak is 25% or 50% or even 100% taller than those on either side of it. In some embodiments, this fraction of features that extend above the majority of the microstructured peaks can be up to 10% (in some embodiments up to 3%, 2%, or even up to 1%). Use of the occasional taller microstructure features may facilitate protecting the uniformly smaller microstructure peaks when the coated substrate moves over the surfaces of rollers in a roll-to-roll coating operation. The occasional taller feature touches the surface of the roller rather than the peaks of the smaller microstructures and so much less of the nanostructured material or whiskers is likely to be scraped or otherwise disturbed as the substrate moves through the coating process. In some embodiments, the microstructure features are substantially smaller than half the thickness of the membrane that the catalyst will be transferred to in making a membrane electrode assembly (MEA). This is so that during the catalyst transfer process, the taller microstructure features do not penetrate through the membrane where they may overlap the electrode on the opposite side of the membrane. In some embodiments, the tallest microstructure features are less than $\frac{1}{3}^{rd}$ or $\frac{1}{4}^{th}$ of the membrane thickness. For the thinnest ion exchange membranes (e.g., about 10 to 15 micrometers in thickness), it may be desirable to have a substrate with microstructured features no larger than about 3 to 4.5 micrometers tall. The steepness of the sides of the V-shaped or other microstructured features or the included angles between adjacent features may in some embodiments be desirable to be on the order of 90° for ease in catalyst transfer during a lamination-transfer process and have a gain in surface area of the electrode that comes from the square root of two (1.414) surface area of the microstructured layer relative to the planar geometric surface of the substrate backing.

In some embodiments, the multiple alternating layers are directly coated onto the nanostructured whiskers, while in others there may be an intermediate (typically conformal) layer(s) such as a functional layer imparting desirable catalytic properties, and may also impart electrical conductivity and mechanical properties (e.g., strengthens and/or protects the nanostructures comprising the nanostructured layer), and low vapor pressure properties. The intermediate layer may also provide nucleation sites which influence the way the subsequent alternating layers deposit and develop a crystalline morphology.

In some embodiments, an intermediate layer comprises an inorganic material or organic material including a polymeric material. Exemplary organic materials include conductive polymers (e.g., polyacetylene), polymers derived from poly-p-xylylene, and materials capable of forming self-assembled layers. Typically the thickness of an intermediate layer is in a range from about 0.2 to about 50 nm. An intermediate layer may be deposited onto the nanostructured whiskers using conventional techniques, including, those disclosed in U.S. Pat. No. 4,812,352 (Debe) and U.S. Pat. No. 5,039,561 (Debe), the disclosures of which are incorporated herein by reference. Typically it is desirable that any method used to provide an intermediate layers(s) avoid disturbance of the nanostructured whiskers by mechanical forces. Exemplary methods include vapor phase deposition (e.g., vacuum evaporation, sputtering (including ion sputtering), cathodic arc deposition, vapor condensation, vacuum sublimation, physical vapor transport, chemical vapor transport, metalorganic chemical vapor deposition, and ion beam assisted deposition) solution coating or dispersion coating (e.g., dip coating, spray coating, spin coating, pour coating (i.e., pouring a liquid over a surface and allowing the liquid to flow over the nanostructured whiskers, followed by solvent removal)), immersion coating (i.e., immersing the nanostructured whiskers in a solution for a time sufficient to allow the layer to adsorb molecules from the solution, or colloid or other dispersed particles from a dispersion), and electrodeposition including electroplating and electroless plating. In some embodiments, the intermediate layer is a catalytic metal, metal alloy, oxide or nitride thereof. Additional details can be found, for example, in U.S. Pat. No. 7,790,304 (Hendricks et al.), the disclosure of which is incorporated herein by reference.

In general, the multiple alternating layers having the specified, and optional compositions, can be sputtered onto the nanostructured whiskers as described in detail in U.S. Pat. No. 5,879,827 (Debe et al.), U.S. Pat. No. 6,040,077 (Debe et al.), and. U.S. Pat. No. 7,419,741 (Vernstrom et al.), the disclosures of which are incorporated herein by reference.

Materials comprising the multiple alternating layers can be sputtered, for example, from a multiple targets (i.e., Pt is sputtered from a first target, Ir is sputtered from a second target, Ru from a third (if present), etc.), or from a target(s) comprising more than one metal. In this case a single layer of the multiple compositions may be preferable.

In some embodiments, sputtering is conducted at least in part in an atmosphere comprising at least a mixture of argon and oxygen, and wherein the ratio of argon to oxygen flow rates into the sputtering chamber are at least 113 sccm/7 sccm.

Typically, the multiple alternating layers comprise at least one layer. Although a layer may consist of a single metal or composition, they often comprise a gradient of compositions, particularly when transitioning from one layer to another. The layers may comprise any of a variety desired or required materials, including Pt, Ir, Ru, or other metal (e.g., Au, Os, Re, Pd, and Rh). Typically, a layer comprising Ir contains at least 30 atomic percent (in some embodiments, at least 40, 50, 60, 70, 75, 80, 90, or even 100 atomic percent) Ir. Typically, a layer comprising Ru contains at least 30 atomic percent (in some embodiments, at least 40, 50, 60, 70, 75, 80, 90, or even 100 atomic percent) Ru.

In some embodiments, at least some of the multiple alternating layers further comprise at least one transition metal (e.g., Cr, Ni, Co, Ti, Ta, Nb, Zr, V, Hf, and Mn) or oxide thereof.

The multiple alternating layers may comprise any order of the materials present (e.g., for multiple alternating layers respectively comprising Pt, Ir, and Ru, the order of the layers comprising respectively Pt, Ir, and Ru, can be, for example, in order Pt, Ir, and Ru; Pt, Ru, and Ir; Ir, Pt, and Ru; Ir, Ru, and Pt; Ru, Pt, and Ir; or, Ru, Ir, Pt.

The resulting outer layer of the multiple alternating layers can be any of the layer materials (e.g., Pt, Ir, Ru, alloys thereof, and oxides thereof).

Typically, the planar equivalent thickness of an individual layer is in a range from 0.5 nm to 5 nm. "Planar equivalent thickness" means, in regard to a layer distributed on a surface, which may be distributed unevenly, and which surface may be an uneven surface (such as a layer of snow distributed across a landscape, or a layer of atoms distributed in a process of vacuum deposition), a thickness calculated on the assumption that the total mass of the layer was spread evenly over a plane covering the same projected area as the surface (noting that the projected area covered by the surface is less than or equal to the total surface area of the surface, once uneven features and convolutions are ignored). In some embodiments, the average bilayer (i.e., two adjacent layers when there are two alternating layers (e.g., one comprising Pt and another comprising Ir) making up the multiple alternating layers) has a planar equivalent thickness of less than 50 Angstroms. In some embodiments, the average trilayer (i.e., three adjacent layers when the three alternating layers (e.g., one comprising Pt, another comprising Ir, and another comprising Ru) making up the multiple alternating layers) has a planar equivalent thickness of less than 75 Angstroms. In some embodiments at least a portion of the tri-layers are up to 50 Angstroms thick.

In some embodiments, the multiple alternating layers collectively comprise up to 0.5 mg/cm$^2$ (in some embodiments, up to 0.25, or even up to 0.1 mg/cm$^2$) catalytic metal (e.g., Groups VII-XI and Periods 5 and 6). In some embodiments, the multiple alternating layers collectively comprise 0.15 mg/cm$^2$ of Pt.

In some embodiments catalyst is coated in-line, in a vacuum immediately following the nanostructured whisker growth step on the microstructured substrate. This may be a more cost effective process so that the nanostructured whisker coated substrate does not need to be re-inserted into the vacuum for catalyst coating at another time or place. If the catalyst alloy coating is done with a single target, it may be desirable that the coating layer be applied in a single step onto the nanostructured whisker so that the heat of condensation of the catalyst coating heats the Pt, Ir, Ru, etc. atoms and substrate surface sufficient to provide enough surface mobility that the atoms are well mixed and form thermodynamically stable alloy domains. Alternatively the substrate can also be provided hot or heated to facilitate this atomic mobility, such as by having the nanostructured whisker coated substrate exit the perylene red annealing oven immediately prior to the catalyst sputter deposition step.

In some embodiments, the multiple alternating layers are radiation annealed at least in part. In some embodiments, the radiation annealing is conducted at an incident energy fluence of at least 20 mJ/mm$^2$, for example, with a 10.6 micrometer wavelength $CO_2$ laser having an average beam power of 30.7 watts and average beam width of 1 mm, that is delivered in the form of 30 microsecond pulses at a repetition rate of 20 kHz while scanning over the surface at about 7.5 m/sec in five sequential passes, each displaced 0.25 mm from the previous pass.

In some embodiments, the radiation annealing is conducted at least in part in an atmosphere comprising an absolute oxygen partial pressure of at least 2 kPa (in some embodiments, at least 5 kPa, 10 kPa, or even at least 20 kPa) oxygen. The radiation annealing (e.g. laser annealing) is useful for rapidly heating the catalyst coating on the whiskers to effectively heat the catalyst coating so that there is sufficient atomic mobility that the alternately deposited layers are further intermixed to form more extensive alloying of the materials and larger crystalline grain sizes. Use of annealing has been observed to benefit activity for oxygen evolution reaction or hydrogen evolution reaction and increase their stability, as shown, for example, in Example 1. It may be desirable for the radiation annealing to be able to be applied at sufficiently rapid web speeds that the process can match the original manufacturing process speeds of the nanostructured catalyst. For example it may be useful if the radiation annealing is conducted in line with the deposition process of the catalyst coating. It may be further be desirable if the radiation annealing is conducted in-line, in the vacuum, immediately follow the catalyst deposition.

It will be understood by one skilled in the art that the crystalline and morphological structure of a catalyst described herein, including the presence, absence, or size of alloys, amorphous zones, crystalline zones of one or a variety of structural types, and the like, may be highly dependent upon process and manufacturing conditions, particularly when three or more elements are combined.

In some exemplary embodiments, catalyst electrodes described, or made as described, herein are electrolyzer anode catalyst, and in other exemplary embodiments electrolyzer cathode catalyst. Both electrolyzer anode and cathode catalysts are useful for example, in fuel cells.

Further, catalysts described herein are useful for providing fuel cell membrane electrode assemblies. "Membrane electrode assembly" refers to a structure comprising a membrane that includes an electrolyte, typically a solid polymer electrolyte, and at least one but more typically two or more electrodes adjoining the membrane.

Catalysts described herein can be used to manufacture catalyst coated membranes (CCM's) or membrane electrode assemblies (MEA's) incorporated in fuel cells such as those described in U.S. Pat. No. 5,879,827 (Debe et al.) and U.S. Pat. No. 5,879,828 (Debe et al.), the disclosures of which are incorporated herein by reference.

MEA's described herein may be used in fuel cells. An MEA is the central element of a proton exchange membrane fuel cell (e.g., a hydrogen fuel cell). Fuel cells are electrochemical cells which produce usable electricity by the catalyzed combination of a fuel such as hydrogen and an oxidant such as oxygen.

An exemplary electrolyzer cell is depicted in FIG. 1. Cell 10 shown in FIG. 1 includes first fluid transport layer (FTL) 12 adjacent anode 14. Adjacent anode 14 is electrolyte membrane 16. Cathode 18 is situated adjacent electrolyte membrane 16, and second fluid transport layer 19 is situated adjacent cathode 18. FTLs 12 and 19 can be referred to as diffuser/current collectors (DCCs) or gas diffusion layers (GDLs). In operation, water is introduced into anode portion of cell 10, passing through first fluid transport layer 12 and over anode 14. Power source 17 applies an electrical current source on cell 10.

Electrolyte membrane 16 permits only the hydrogen ions or protons to pass through electrolyte membrane 16 to the cathode portion of cell 10. The electrons cannot pass through electrolyte membrane 16 and, instead, flow through an external electrical circuit in the form of electric current.

The hydrogen ions (H+) combine with the electrons over cathode 18, and hydrogen gas is collected through second fluid transport layer 19 situated adjacent cathode 18. Oxygen gas is collected at anode of cell 10 via first fluid transport layer 12 situated adjacent the anode 14.

Gas diffusion layers (GDL's) facilitate gas transport to and from the anode and cathode electrode materials and conduct electrical current. The GDL is both porous and electrically conductive, and is typically composed of carbon fibers. The GDL may also be called a fluid transport layer (FTL) or a diffuser/current collector (DCC). In some embodiments, the anode and cathode electrode layers are applied to GDL's and the resulting catalyst-coated GDL's sandwiched with a PEM to form a five-layer MEA. The five layers of a five-layer MEA are, in order: anode GDL, anode electrode layer, PEM, cathode electrode layer, and cathode GDL. In other embodiments, the anode and cathode electrode layers are applied to either side of the PEM, and the resulting catalyst-coated membrane (CCM) is sandwiched between two GDL's to form a five-layer MEA.

A PEM used in a CCM or MEA described herein may comprise any suitable polymer electrolyte. Exemplary useful polymer electrolytes typically bear anionic functional groups bound to a common backbone, which are typically sulfonic acid groups but may also include carboxylic acid groups, imide groups, amide groups, or other acidic functional groups. Exemplary useful polymer electrolytes are typically highly fluorinated and most typically perfluorinated. Exemplary useful electrolytes include copolymers of tetrafluoroethylene and at least one fluorinated, acid-functional comonomers. Typical polymer electrolytes include those available from DuPont Chemicals, Wilmington Del., under the trade designation "NAFION" and from Asahi Glass Co. Ltd., Tokyo, Japan, under the trade designation "FLEMION". The polymer electrolyte may be a copolymer of tetrafluoroethylene (TFE) and $FSO_2$—$CF_2CF_2CF_2CF_2$—O—$CF$=$CF_2$, described in U.S. Pat. No. 6,624,328 (Guerra) and U.S. Pat. No. 7,348,088 (Hamrock et al.) and U.S. Pub No. US2004/0116742 (Guerra), the disclosures of which are incorporated herein by reference. The polymer typically has an equivalent weight (EW) up to 1200 (in some embodiments, up to 1100, 1000, 900, or even up to 800).

The polymer can be formed into a membrane by any suitable method. The polymer is typically cast from a suspension. Any suitable casting method may be used, including bar coating, spray coating, slit coating, and brush coating. Alternately, the membrane may be formed from neat polymer in a melt process such as extrusion. After forming, the membrane may be annealed, typically at a temperature of at least 120° C. (in some embodiments, at least 130° C., 150 C, or higher). The membrane typically has a thickness up to 50 micrometers (in some embodiments, up to 40 micrometers, 30 micrometers, or even up to 25 micrometers.

The polymer membrane can also include a support matrix consisting of a porous network of interlinked fibers that will provide the ion exchange polymer (ionomer), with additional mechanical strength to withstand the sometimes large pressure differentials across the membrane due to the high pressure of the cathode side during hydrogen evolution. The support matrix can be made of an expanded polytetrafluoroethylene (e.g., that available under the trade designation "TEFLON" from DuPont Chemicals, Wilmington Del.) or partially fluorinated fibrous matrix that will be stable in the acidic environment of the ionomer.

In some embodiments, the membrane has a first proton conducting polymer reinforced with a nanofiber mat;

wherein the nanofiber mat is made from a nanofiber comprising a fiber material selected from polymers and polymer blends; wherein the fiber material has a fiber material proton conductivity; wherein the first proton conducting polymer has a first proton conducting polymer conductivity; and wherein the fiber material proton conductivity is less than the first proton conducting polymer conductivity.

In some embodiments the fiber material in the membrane may include highly fluorinated polymer, perfluorinated polymer, hydrocarbon polymer, blends and combinations thereof. In some embodiments, the fiber material in the membrane may include a polymer suitable for electrospinning selected from the group consisting of PVDF, PES, PEI, PBI, PPO, PEEK, PPES, PEK, blends and combinations thereof. In some embodiments, the fiber material in the membrane may be an electrospun nanofiber. In some embodiments, the fiber material in the electrolyte membrane may include a stabilizing additive, which may include an element selected from Mn or Ce.

Additional details for exemplary membranes can be found, for example, in U.S. Pat. Pub. No. 2008/0113242 and 2002/0100725, and 2011/036935, the disclosures of which are incorporated herein by reference.

Optionally, the membranes are washed in acid (e.g., 1 molar nitric acid to remove any metal cation impurities, or nitric plus hydrogen peroxide to remove organic impurities, followed by rinsing in deionized water) prior to deposition of the nanostructured whiskers to remove cation impurities. Heating the washing bath (e.g., to 30° C., 40° C., 50° C., 60° C., 70° C. or even 80° C.) may make the cleaning faster. Benefits of acid washing the membrane may depend on the particular membrane.

In making an MEA, GDL's may be applied to either side of a CCM. The GDL's may be applied by any suitable means. Suitable GDLs include those stable at the electrode potentials of use. For example, the cathode GDL can contain free carbon black or carbon fibers since it is operated at low potentials sufficient for adequate hydrogen evolution, whereas the anode GDL is typically made of Ti or some other stable material at the high potentials characteristic of oxygen evolution. Typically, the cathode GDL is a carbon fiber construction of woven or non-woven carbon fiber constructions. Exemplary carbon fiber constructions include those available, for example, under the trade designation "TORAY" (carbon paper) from Toray, Japan; "SPECTRACARB" (carbon paper) from Spectracorb, Lawrence, Mass.; and "ZOLTEK" (Carbon Cloth) from St. Louis, Mo., as well as from Mitibushi Rayon Co, Japan; and Freudenberg, Germany. The GDL may be coated or impregnated with various materials, including carbon particle coatings, hydrophilizing treatments, and hydrophobizing treatments such as coating with polytetrafluoroethylene (PTFE).

Typically, the electrolyzer anode GDL is metal foam or porous metal screen or mesh comprised, for example, of Au, Ti, Ta, V, Zr or a metal alloy that will not corrode (e.g., Ti-10V-5Zr) and yet have adequate electrical conductivity (e.g., by sputter deposition or electroplating a layer of Pt or Au onto the surface in the case of a Ti GDL) for the electrolyzer operation at the potentials of use above the thermodynamic potential for water oxidation at 1.23 V.

In use, MEAs described herein are typically sandwiched between two rigid plates, known as distribution plates, also known as bipolar plates (BPP's) or monopolar plates. Like the GDL, the distribution plate must be electrically conductive and be stable at the potentials of the electrode GDL against which it is place. The distribution plate is typically made of materials such as carbon composite, metal, or plated metals. As for the GDL's, the cathode plate of the electrolyzer can be any material common to use in fuel cells, whereas the anode plate of the electrolyzer must be fabricated of a material that will not corrode above potentials of 1.23 volts, or up to 1.5 volts, 2.5 volts, or higher relative to the potential of a reversible hydrogen electrode (RHE). An exemplary coating for the anode plate comprises Ti-10V-5Zr. The distribution plate distributes reactant or product fluids to and from the MEA electrode surfaces, typically through at least one fluid-conducting channel engraved, milled, molded, or stamped in the surface(s) facing the MEA(s). These channels are sometimes designated a flow field. The distribution plate may distribute fluids to and from two consecutive MEA's in a stack, with one face directing water to and oxygen from the anode of the first MEA while the other face directs evolved hydrogen and water (that crosses over the membrane) away from the cathode of the next MEA, hence the term "bipolar plate." Alternately, the distribution plate may have channels on one side only, to distribute fluids to or from an MEA on only that side, which may be termed a "monopolar plate." The term bipolar plate, as used in the art, typically encompasses monopolar plates as well. A typical fuel cell stack comprises a number of MEA's stacked alternately with bipolar plates.

Electrocatalysts are useful, for example, in generating $H_2$ and $O_2$ from water. For example, of generating hydrogen and oxygen from water by a method comprising:

providing a membrane electrode assembly comprising an anode catalyst comprising nanostructured whiskers having thereon multiple alternating layers comprising respectively in any order Pt and Ir (or other anode catalyst) and a cathode;

providing water contact the anode catalyst; and providing an electrical potential with sufficient proton current across the membrane electrode assembly (i.e., cathode to anode) to convert at least a portion of the water to hydrogen and oxygen. In some embodiments, the Pt, Ir, and Ru are present in atomic ratios in a range from 0.1:5:5 to 10:0.05:0.05.

Exemplary Embodiments

1A. A method of making catalyst electrode comprising:

sputtering at least Pt and Ir onto nanostructured whiskers to provide multiple alternating layers comprising respectively in any order Pt and Ir; and radiation annealing (e.g., laser annealing) at least some of the multiple alternating layers comprising respectively Pt and Ir at least in part in an atmosphere comprising an absolute oxygen partial pressure of at least 2 kPa (in some embodiments, at least 5 kPa, 10 kPa, or even at least 20 kPa) oxygen.

2A. The method of Embodiment 1A, wherein the radiation annealing is at least in part conducted at an incident energy fluence of at least 20 mJ/mm$^2$.

3A. The method of either Embodiment 1A or 2A, wherein the Pt and Ir are present in an atomic ratio in a range from 10:1 to 1:10.

4A. The method of any preceding Embodiment, wherein the Pt is sputtered from a first target and the Ir is sputtered from a second target.

5A. The method of any of Embodiments 1A to 3A, wherein at least a portion of the Pt and Ir are sputtered from a common target.

6A. The method of any preceding Embodiment, wherein the multiple alternating layers collectively comprise up to 1 mg/cm$^2$ catalytic metal.

7A. The method of any preceding Embodiment, wherein the multiple alternating layers collectively comprise 0.15 mg/cm² of Pt.

8A. The method of any preceding Embodiment, wherein the multiple alternating layers have an outermost layer comprising Ir.

9A. The method of any preceding Embodiment, wherein at least some of the multiple alternating layers further comprise at least one transition metal or oxide thereof.

10A. The method of any preceding Embodiment, wherein the whiskers are attached to a backing.

11A. The method of Embodiment 10A, wherein the backing is a membrane, and wherein the method further comprises acid washing to remove cation impurities prior to attaching the nanostructured whiskers to membrane.

12A. The method of Embodiment 10A, wherein the backing has a microstructure on at least one of its surfaces.

1B. A method of making catalyst electrode comprising:
sputtering at least Pt and Ir onto nanostructured whiskers to provide multiple alternating layers comprising respectively in any order Pt and Ir, wherein at least a portion of the multiple alternating layers are up to 20 (in some embodiments, less than 15, 10, or even less than 5) Angstroms thick.

2B. The method of Embodiment 1B, wherein the sputtering is conducted at least in part in an atmosphere comprising at least a mixture of argon and oxygen, and wherein the ratio of argon to oxygen flow rates into the sputtering chamber are at least 113 sccm/7 sccm.

3B. The method of either Embodiment 1B or 2B, wherein the Pt and Ir are present in an atomic ratio in a range from 1:5 to 5:1.

4B. The method of any preceding B Embodiment, wherein the Pt is sputtered from a first target and the Ir is sputtered from a second target.

5B. The method of any of Embodiments 1B to 3B, wherein at least a portion of the Pt and Ir are sputtered from a common target.

6B. The method of any preceding B Embodiment, wherein the multiple alternating layers collectively comprise up to 1 mg/cm² catalytic metal.

7B. The method of any preceding B Embodiment, wherein the multiple alternating layers collectively comprise 0.15 mg/cm² Pt.

8B. The method of any preceding B Embodiment, wherein the multiple alternating layers have an outermost comprising Ir.

9B. The method of any preceding B Embodiment, wherein at least some of the multiple alternating layers further comprise at least one transition metal or oxide thereof.

10B. The method of any preceding B Embodiment, wherein the whiskers are attached to a backing.

11B. The method of Embodiment 10B, wherein the backing is a membrane, and wherein the method further comprises acid washing to remove cation impurities prior to attaching the nanostructured whiskers to membrane.

12B. The method of Embodiment 10B, wherein the backing has a microstructure on at least one of its surfaces.

1C. A method of making catalyst electrode comprising:
sputtering at least Pt, Ir, and Ru onto nanostructured whiskers to provide multiple alternating layers comprising respectively in any order Pt, Ir, and Ru.

2C. The method of Embodiment 1C further comprising radiation annealing (e.g., laser annealing) the nanostructured thin film catalyst at least in part in air with an irradiation at an incident energy fluence of at least 20 mJ/mm².

3C. The method of either Embodiment 1C or 2C, wherein a tri-layer set of the multiple alternating layers comprise respectively order Pt, Ru, and Ir.

4C. The method of either Embodiment 2C or 3C, wherein a tri-layer set of the multiple alternating layers comprise respectively order Ir, Pt, and Ru.

5C. The method of either Embodiment 2C or 3C, wherein a tri-layer set of the multiple alternating layers comprise respectively order Ir, Ru, and Pt.

6C. The method of either Embodiment 2C or 3C, wherein a tri-layer set of the multiple alternating layers comprise respectively order Ru, Pt, and Ir.

7C. The method of either Embodiment 2C or 3C, wherein a tri-layer set of the multiple alternating layers comprise respectively order Ru, Ir, and Pt.

8C. The method of any preceding C Embodiment, wherein at least a portion of the layers are up to 50 Angstroms thick.

9C. The method of any preceding C Embodiment, wherein the Pt, Ir, and Ru are present in atomic ratios in a range from 0.1:5:5 to 10:0.05:0.05.

10C. The method of any preceding C Embodiment, wherein the Pt is sputtered from a first target, the Ir is sputtered from a second target, and the Ru is sputtered from a third target.

11C. The method of any of Embodiments 1C to 9C, wherein at least a portion of at least two of the Pt, Ir, and Ru are sputtered from a common target.

12C. The method of any preceding C Embodiment, wherein the multiple alternating layers collectively comprise up to 1 mg/cm² catalytic metal.

13C. The method of any preceding C Embodiment, wherein the multiple alternating layers collectively comprise 0.15 mg/cm² Pt.

14C. The method of any preceding C Embodiment, wherein the multiple alternating layers have an outermost layer comprising at least one of Ir or oxide thereof.

15C. The method of any preceding C Embodiment, wherein at least some of the multiple alternating layers further comprise at least one transition metal or oxide thereof.

16C. The method of any preceding C Embodiment, wherein the whiskers are attached to a backing.

17C. The method of Embodiment 16C, wherein the backing is a membrane, and wherein the method further comprises acid washing to remove cation impurities prior to attaching the nanostructured whiskers to membrane.

18C. The method of Embodiment 16C, wherein the backing has a microstructure on at least one of its surfaces.

1D. A method of generating hydrogen and oxygen from water, the method comprising:
providing a membrane electrode assembly comprising an anode catalyst comprising nanostructured whiskers having thereon multiple alternating layers comprising respectively in any order Pt and Ir (or other anode catalyst) and a cathode;
providing water contact the catalyst; and
providing an electrical potential with sufficient current across the a membrane electrode assembly (i.e., anode to cathode) to convert at least a portion of the water to hydrogen and oxygen on the cathode and anode respectively.

2D. The method of Embodiment 1D further comprising layers comprising Ru.

3D. The method of either Embodiment 1D or 2D, wherein a tri-layer set of the multiple alternating layers comprise respectively order Pt, Ru, and Ir.

4D. The method of either Embodiment 1D or 2D, wherein a tri-layer set of the multiple alternating layers comprise respectively order Ir, Pt, and Ru.

5D. The method of either Embodiment 1D or 2D, wherein a tri-layer set of the multiple alternating layers comprise respectively order Ir, Ru, and Pt.

6D. The method of either Embodiment 1D or 2D, wherein a tri-layer set of the multiple alternating layers comprise respectively order Ru, Pt, and Ir.

7D. The method of either Embodiment 1D or 2D, wherein a tri-layer set of the multiple alternating layers comprise respectively order Ru, Ir, and Pt.

8D. The method of any preceding D Embodiment, wherein at least a portion of the layers are up to 50 Angstroms thick.

9D. The method of any preceding D Embodiment, wherein the Pt, Ir, and Ru are present in atomic ratios in a range from 0.1:5:5 to 10:0.05:0.05.

10D. The method of any preceding D Embodiment, wherein the multiple alternating layers collectively comprise up to 2 mg/cm$^2$ catalytic metal.

11D. The method of any preceding D Embodiment, wherein the multiple alternating layers collectively comprise 0.15 mg/cm$^2$ Pt.

12D. The method of any preceding D Embodiment, wherein the multiple alternating layers have an outermost comprising at least one of Ir, Ru, or oxide thereof.

13D. The method of any preceding D Embodiment, wherein at least some of the multiple alternating layers further comprise at least one transition metals or oxide thereof.

Advantages and embodiments of this invention are further illustrated by the following examples, but the particular materials and amounts thereof recited in these examples, as well as other conditions and details, should not be construed to unduly limit this invention. All parts and percentages are by weight unless otherwise indicated.

EXAMPLES

General Method For Preparing Nanostructured Whiskers

Nanostructured whiskers were prepared by thermal annealing a layer of perylene red pigment (C.I. Pigment Red 149, also known as "PR149", obtained from Clariant, Charlotte, N.C.), which was sublimation vacuum coated onto microstructured catalyst transfer polymer substrates (MCTS) with a nominal thickness of 200 nm), as described in detail in U.S. Pat. No. 4,812,352 (Debe), the disclosures of which are incorporated herein by reference.

A roll-good web of the MCTS (made on a polyimide film obtained from E.I. du Pont de Nemours, Wilmington, Del. under trade designation "KAPTON") was used as the substrate on which the PR 149 was deposited. The MCTS substrate surface had V-shaped features with about 3 micrometers tall peaks, spaced 6 micrometers apart. A nominally 100 nm thick layer of Cr was then sputter deposited onto the MCTS surface using a DC magnetron planar sputtering target and typical background pressures of Ar and target powers known to those skilled in the art sufficient to deposit the Cr in a single pass of the MCTS web under the target at the desired web speed. The Cr coated MCTS web then continued over a sublimation source containing the PR-149 pigment material. The PR 149 was heated to a controlled temperature near 500° C. so as to generate sufficient vapor pressure flux to deposit 0.022 mg/cm$^2$, or approximately 220 nm thick layer of the PR-149 in a single pass of the web over the sublimation source. The mass or thickness deposition rate of the sublimation can be measured in any suitable fashion known to those skilled in the art, including optical methods sensitive to film thickness, or quartz crystal oscillator devices sensitive to mass. The PR-149 coating was then converted to the whisker phase by thermal annealing, as described in detail in U.S. Pat. No. 5,039,561 (Debe), the disclosure of which is incorporated herein by reference, by passing the PR-149 coated web through a vacuum having a temperature distribution sufficient to convert the PR-149 as-deposited layer into a layer of oriented crystalline whiskers at the desired web speed, such that the whisker layer has an average whisker areal number density of 68 whiskers per square micrometer, determined from SEM images, with an average length of 0.6 micrometer.

General Method For Preparing Nanostructured Thin Film (NSTF) Catalyst Layers

Nanostructured thin film (NSTF) catalyst layers were prepared by sputter coating catalyst films onto the layer of nanostructured whiskers (which were prepared as described above).

More specifically, Pt or Pt binary and ternary alloys were magnetron sputter deposited onto the nanostructured PR 149 whisker coated substrates prepared as above, using typical Ar sputter gas pressures of about 5 mTorr (0.66 Pa), and 2"×10" (5 centimeter×25.4 centimeter) rectangular sputter targets (obtained from Sophisticated Alloys, Inc., Butler, Pa.). For Example 2, oxygen was blended into the chamber with the Ar at relative flow rates of 7:113 sccm, respectively to provide a more oxidizing environment for the alloy deposition. The vacuum chamber used is depicted schematically in FIG. 4A of U.S. Pat. No. 5,879,827 (Debe et al.), the disclosure of which is incorporated herein by reference, wherein the PR-149 coated MCTS substrates are mounted on a drum that is then rotated so as to pass the substrate over sequential DC magnetron sputtering targets, each having a different elemental composition. For each rotation of the drum and hence each pass of the substrate over the planar targets, a combined bi-layer of desired thickness was deposited on the whiskers for two targets, or tri-layer of desired thickness for three targets. The DC magnetron sputtering target deposition rates were measured by standard methods known to those skilled in the art. Each magnetron sputtering target power was then controlled to give the desired deposition rate of that element at the operating drum speed sufficient to give the desired bi-layer or tri-layer thicknesses of catalysts on the whisker coated substrates for each rotation of the drum. Bi-layer and tri-layer thicknesses refer to the planar equivalent thickness of the deposited material, as-measured if the same deposition rate and time were used to deposit the films on a perfectly flat surface assuming that the coating was spread over the surface evenly.

Typical bi-layer thicknesses (total planar equivalent thickness of a first layer and the next occurring second layer) were about 16 Angstroms. For example, for a PtIr alloy film deposited on the whiskers, a $Pt_{50}Ir_{50}$ atomic composition alloy would have sub-layers of Pt and Ir of approximately 8 Angstroms each to make a 16 Angstrom bi-layer. To obtain a total target loading of alloy on the substrate whiskers, the number of drum rotations was controlled. For example, to obtain a $Pt_{50}Ir_{50}$ film coating containing 0.15 mg/cm$^2$ of Pt, with 16 Angstrom bi-layers, approximately 87 rotations of the drum would be required assuming a Pt film density of 21.45 mg/cm$^3$.

Subsequent to the deposition of the alloy catalysts onto the whisker coated MCTS described above, in Examples 1 a post-deposition process was applied to the catalyst layers to effectively anneal them, as described in U.S. Pat. Appl. Having Ser. No. 61/328,064, filed on Apr. 26, 2010, the disclosure of which is incorporated herein by reference). The annealing process is accomplished by causing a $CO_2$ laser beam to raster over the sample catalyst surface under a controlled atmosphere at a sufficient incident energy fluence, beam size, rastering speed and line-step size or hatch so as to induce sufficient heating in the bi-layer or tri-layer alloy catalyst that the Pt crystalline grains grow (as measured by X-ray diffraction increased as described in U.S. Pat. Appl. Having Ser. No. 61/328,064, filed on Apr. 26, 2010. In contrast to the laser annealing environmental conditions found optimum as described in U.S. Pat. Appl. Having Ser. No. 61/328,064, filed on Apr. 26, 2010 and that done in instant Example 1, is that the laser annealing was intentionally done herein in the presence of sufficient oxygen in order to try and induce oxidation of the catalyst alloy components to make them more effective for oxygen evolution on the anode of an electrolyzer as opposed to oxygen reduction on the cathode of a fuel cell.

General Method For Preparing Catalyst Coated Membrane (CCM)

Catalyst-coated-membranes (CCM's) were made by transferring the catalyst coated whiskers described above onto one surface (½-CCM) or both surfaces (full CCM) of a proton exchange membrane (PEM) using the processes as described in detail in U.S. Pat. No. 5,879,827 (Debe et al.). The catalyst transfer was accomplished by hot roll lamination onto either perfluorinated sulfonic acid membrane made by and commercially available from 3M Company, St. Paul, Minn. with an nominal equivalent weight of 850 and thickness of 35 micrometers (used as made), or 7 mil (175 micrometer) thick membrane (obtained under the trade designation "NAFION 117" from E.I. du Pont de Nemours, Wilmington, Del.) having an equivalent weight of 1100. The membranes obtained under the trade designation "NAFION 117" were pre washed with acid to remove cation impurities. CCMs were made with 850 equivalent weight PEM (available from 3M Company), the hot roll temperatures were 350° F. (177° C.) and the gas line pressure fed to force laminator rolls together at the nip ranged from 150 to 180 psi (1.03 MPa-1.24 MPa), while for the membrane ("NAFION 117") the hot roll temperatures were 350° F. (177° C.) and the gas line pressure fed to force laminator rolls together at the nip ranged from 120 to 150 psi (0.83 MPa-1.03 MPa). The catalyst coated MCTS was precut into 13.5 cm×13.5 cm square shapes and sandwiched onto one or both side(s) of a larger square of PEM. The PEM with catalyst coated MCTS on one or both side(s) of it were placed between 2 mil (50 micrometer) thick polyimide film and then coated paper on the outside prior to passing the stacked assembly through the nip of the hot roll laminator at a speed of 1.2 ft/min (37 cm/min). Immediately after passing through the nip, while the assembly was still warm, the layers of polyimide and paper were quickly removed and the Cr-coated MCTS substrates were peeled off the CCM (or ½-CCM) by hand, leaving the catalyst coated whiskers stuck to the PEM surface(s).

General Method For Testing Full CCM

Full CCM's fabricated as described above were then tested in a $H_2/O_2$ electrolyzer single cell. The full CCM's were installed with appropriate gas diffusion layers directly into a 50 cm² test cell (obtained from Fuel Cell Technologies, Albuquerque, N. Mex.), with quad serpentine flow fields. The normal graphite flow field block on the anode side was replaced with a Pt-plated Ti flow field block of the same dimensions and flow field design to withstand the high anode potentials during electrolyzer operation. Purified water with a resistivity of 18 MΩ water was supplied to the anode at 300 mL/min. A 320 A/15 W power supply (obtained under the trade designation "HP 6950L/T60," from Hewlett Packard Company, Palo Alto, Calif.), was applied to the cell and used to control the applied cell voltage or current density. The cells were conditioned by operating the cell at 90° C. and 4 A/cm² for four hours or more until performance stabilized.

General Method For Testing ½-CCM

The ½-CCM's based on the PEM ("NAFION 117") prepared as described above were tested according to the method for testing full CCM's except by attaching standard electrodes with 2 mg/cm² of commercially available catalyst-blacks as the opposite electrode. If the ½ CCM's prepared above were tested as the cathode, the standard electrodes used as anode contained PtIr-blacks. If the ½ CCM's prepared above were tested as the anode, the standard electrodes used as cathode contained Pt-blacks.

The ½-CCM's based on 35 micrometer PEM (available from 3M Company), additional ½-CCM's comprising standard catalyst-black electrodes attached to either 5 mil (125 micrometer thick, 1100 equivalent weight membrane ("NAFION 117") or a 4 mil (100 micrometer) thick, 792 equivalent weight membrane were prepared. The two ½ CCMs were then bonded membrane side to membrane side at 350° F. (177° C.). The full CCM (made from the combined ½-CCM's) were then tested as described above in general method for testing full CCM.

Comparative Example A

Nanostructured whiskers prepared as described above were sputter coated with pure Pt coatings in pure Ar according to the general method for preparing nanostructured thin film (NSTF) catalyst layers. The pure Pt was deposited with a loading of 0.2 mg/cm². Full-CCM's were prepared with the resulting NSTF-Pt catalysts layers using acid washed membrane ("NAFION 117") by the hot-roll lamination process described above. The full CCM was mounted into the 50 cm² electrolyzer cell and tested according to general process for testing full CCM, producing polarization curve 20 shown in FIG. 2.

Comparative Example B

Figure 2:
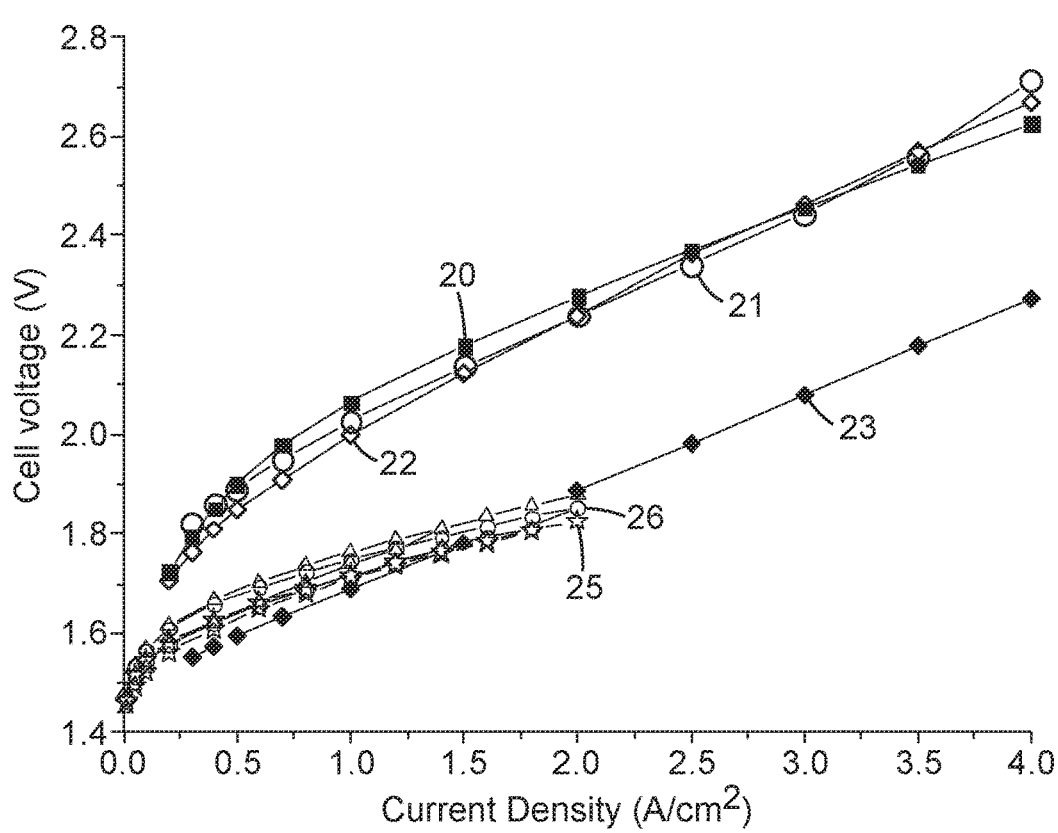
FIG. 2 shows polarization curves for Comparative Examples A-D and Examples 1-3.

Comparative Example B was prepared in the same manner as Comparative Example A, except that a PtIr alloy coating was sputter deposited in pure Ar onto nanostructured whiskers. The PtIr alloy was $Pt_{50}Ir_{50}$ and was deposited to a bi-layer thickness of 16 Angstrom. The catalyst coating contained bi-layers of Pt:Ir at 50:50 atomic ratios, to a total Pt loading of 0.15 mg/cm². A ½-CCM was prepared using the resulting NSTF-$Pt_{50}Ir_{50}$ catalyst layers using acid washed membrane ("NAFION 117") following the general process for preparing CCM. The resulting ½ CCM was tested as the anode using the general method for testing ½ CCM based on membranes ("NAFION 117") wherein the standard cathode was 2 mg/cm² Pt-black. Polarization curve 21 generated for Comparative Example B is shown in FIG. 2.

Comparative Example C

To prepare Comparative Example C, first, an NSTF catalyst layer containing $Pt_{50}Ir_{50}$ alloy deposited as a bi-layer thickness of 16 Angstroms was prepared. The resulting NSTF catalyst layer had bi-layers of Pt:Ir 50:50 atomic ratios and a Pt loading of 0.15 mg/cm$^2$ as described above for Comparative Example B. Then, a second NSTF catalyst layer containing $Pt_{68}Co_{29}Mn_3$ alloy was prepared by sputter coating in pure Ar using the method process described above for preparing NSTF catalyst layers. Two sequential targets of Pt and $Co_{10}Mn_1$ were used to form bi-layers 5 nm thick up to a Pt loading of 0.15 mg/cm$^2$. A full-CCM was prepared by hot roll lamination method described above for preparing CCM. The first and second NSTF catalyst layers were laminated to either side of an acid washed membrane ("NAFION 117"). The full CCM was tested using the method described above for testing full CCM. Polarization curve 22 generated for Comparative Example C is shown in FIG. 2.

Comparative Example D

A full CCM on membrane ("NAFION 117") with 2 mg/cm$^2$ of PtIr-blacks on the anode and 2 mg/cm$^2$ of Pt-blacks on the cathode was prepared and tested (to be used as a baseline) using the method for testing full CCM. Generated polarization curve 23 is shown in FIG. 2.

Example 1

Example 1 NSTF catalyst was prepared as described for Comparative Example B (NSTF-$Pt_{50}Ir_{50}$ alloy with 16 Angstrom bi-layer thicknesses and a Pt loading of 0.15 mg/cm$^2$ on nanostructured whiskers). The catalyst layer was then laser annealed in air at ambient pressure, using the laser scanning system and configuration described in U.S. Pat. Appl. Having Ser. No. 61/328,064, filed on 26 Apr. 2010, the disclosure of which is incorporated herein by reference. The $CO_2$ laser scan rate was 4.5 m/sec, pulse length 30 microseconds, scan repetition rate 20 kHz, "hatch" or displacement of the beam between each scan across the sample was 0.25 mm, spot size was 250 micrometer and power setting was 52% of maximum power. The average beam power was 30.7 W.

Beam polarization was parallel to the MCTS grooves on the catalyst film substrate.

Figure 3:
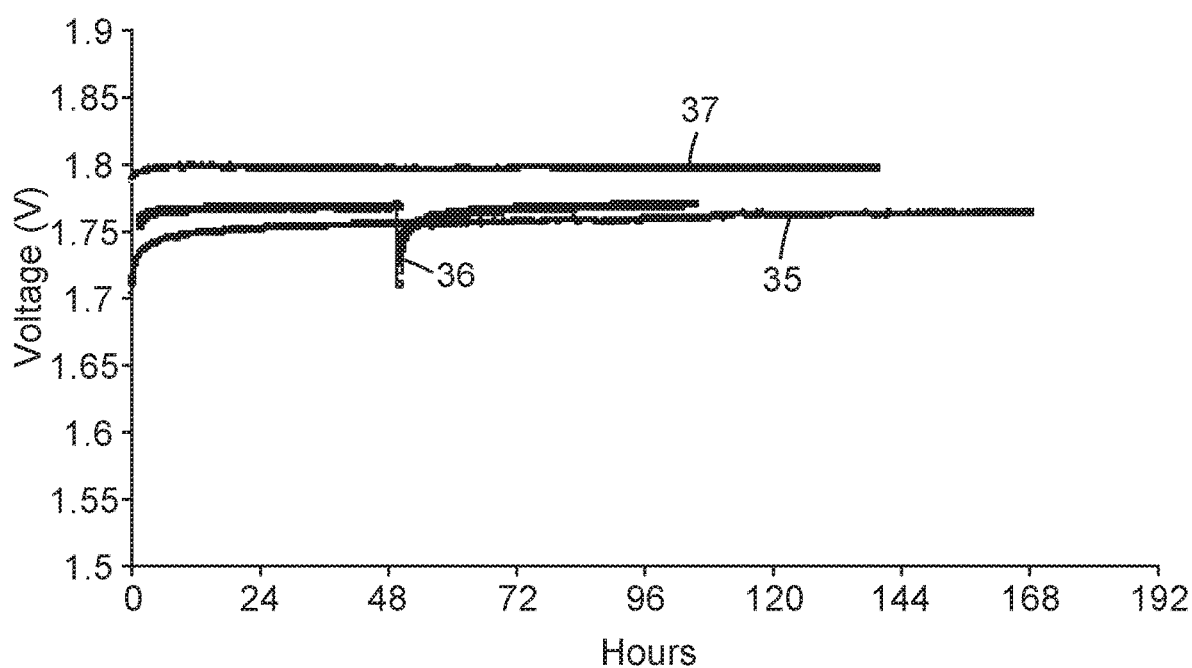
FIG. 3 are Voltage (V) versus time (hours) plots for Examples 1-3.

A ½-CCM was fabricated by lamination transfer of the laser annealed catalyst onto a 35 micrometer thick, 850 equivalent weight PEM (3M Company) according to the general method for preparing CCM. The resulting ½-CCM was bonded PEM to PEM at 350° F. (177° C.) to another ½-CCM fabricated with membrane ("NAFION 117") with an equivalent weight of 792, thickness of 100 micrometers and standard cathode of 2 mg/cm$^2$ Pt-black. The complete CCM was then tested following the method for testing full CCM. Generated polarization curve 25*d* is shown in FIG. 2. A plot of the voltage vs. time curve at a constant current density is shown in FIG. 3, wherein the curve for Example 1 is designated as 35.

Example 2

The Example 2 NSTF catalyst (NSTF-$Pt_{50}(Ir_{25}Ru_{25})$) was deposited using the method described above for preparing NSTF catalyst layer. The Example 2 NSTF catalyst layer was prepared by sputtering Pt, Ir, and Ru from three separate targets in Ar with $O_2$ at relative flow rates of 113 sccm and 7 sccm, respectively. The resulting NSTF catalyst layer had a catalyst loading of 0.15 $mg_{Pt}$/cm$^2$ and each tri-layer was 10 Angstroms thick.

A ½-CCM was made by laminating the NSTF-catalyst layer of Example 2 to one side of a 800 equivalent weight 35 micrometer thick membrane (available from 3M Company). The resulting ½-CCM was made into a full CCM and tested in the same manner as Example 1. Generated polarization curve 26 is shown in FIG. 2. A plot of the voltage vs. time curve at a constant current density is shown in FIG. 3, wherein the curve for Example 2 is designated as 36.

Example 3

Example 3 was prepared in the same manner as Example 2 (the same catalyst composition and loading as in Example 2) but, the sputtering was in pure Ar with no additional flow of $O_2$ into the chamber. Additionally, the NSTF catalyst layer of Example 3 was laser annealed as in Example 1 except for the significant differences that the laser annealing was done in a substantially oxygen-free environment of sub-atmospheric pressure (200 Torr (26.7 KPa)) of $N_2$ with 4% $H_2$, and a laser power of 48% of the maximum. The NSTF catalyst layer of Example 3 was then made into an ½-CCM and tested as described for Example 1. Generated polarization curve 27 is shown in FIG. 2. A plot of the voltage vs. time curve at a constant current density is shown in FIG. 3, wherein the curve for Example 3 is designated as 37.

Foreseeable modifications and alterations of this disclosure will be apparent to those skilled in the art without departing from the scope and spirit of this invention. This invention should not be restricted to the embodiments that are set forth in this application for illustrative purposes.

What is claimed is:

1. A method of making an anode catalyst electrode comprising:
   sputtering at least Pt and Ir onto nanostructured whiskers to provide multiple alternating layers comprising respectively in any order Pt and Ir; and
   radiation annealing at least some of the multiple alternating layers comprising respectively Pt and Ir at least in part in an atmosphere comprising an absolute oxygen partial pressure of at least 2 kPa oxygen to provide the anode catalyst electrode.

2. The method of claim 1, wherein the radiation annealing is at least in part conducted at an incident energy fluence of at least 20 mJ/mm$^2$.

3. The method of claim 1, wherein the Pt and Ir are present in an atomic ratio in a range from 10:1 to 1:10.

4. The method of claim 1, wherein the whiskers are attached to a backing.

5. The method of claim 4, wherein the backing is a membrane, and wherein the method further comprises acid washing to remove cation impurities prior to attaching the nanostructured whiskers to the membrane.

6. A method of making an anode catalyst electrode comprising:
   sputtering at least Pt and Ir onto nanostructured whiskers to provide multiple alternating layers comprising respectively in any order Pt and Ir, wherein at least a portion of the multiple alternating layers are up to 20 Angstroms thick, to provide the anode catalyst electrode to provide the anode catalyst electrode.

7. The method of claim 6, wherein the Pt and Ir are present in an atomic ratio in a range from 1:5 to 5:1.

8. The method of claim 6, wherein the whiskers are attached to a backing.

9. The method of claim 8, wherein backing is a membrane, and wherein the method further comprises acid washing to remove cation impurities prior to attaching the nanostructured whiskers to the membrane.

10. A method of making an anode catalyst electrode comprising:
sputtering at least Pt, Ir, and Ru onto nanostructured whiskers to provide multiple alternating layers comprising respectively in any order Pt, Ir, and Ru to provide the anode catalyst electrode.

11. The method of claim 10 further comprising radiation annealing at least some of the multiple alternating layers comprising respectively in any order Pt, Ir, and Ru catalyst at least in part in air with an irradiation at an incident energy fluence of at least 20 mJ/mm$^2$.

12. The method of claim 10, wherein the Pt, Ir, and Ru are present in atomic ratios in a range from 0.1:5:5 to 10:0.05:0.05.

13. The method of claim 10, wherein the whiskers are attached to a backing.

14. The method of claim 13, wherein backing is a membrane, and wherein the method further comprises acid washing to remove cation impurities prior to attaching the nanostructured whiskers to the membrane.

15. A method of generating hydrogen and oxygen from water, the method comprising:
providing a membrane electrode assembly comprising an anode catalyst comprising nanostructured whiskers having thereon multiple alternating layers comprising respectively in any order Pt and Ir, and a cathode;

providing water in contact with the catalyst; and providing an electrical potential with sufficient current across the membrane electrode assembly to convert at least a portion of the water to hydrogen and oxygen on the cathode and anode respectively.

* * * * *